US009824162B1

(12) United States Patent
Shoham et al.

(10) Patent No.: US 9,824,162 B1
(45) Date of Patent: Nov. 21, 2017

(54) ASSOCIATIVE MEMORY INCLUDING MULTIPLE CASCADED ASSOCIATIVE MEMORY BLOCKS AND ITS USE IN FORWARDING PACKETS IN A NETWORK

(71) Applicant: Cisco Technology, Inc., San Jose, CA (US)

(72) Inventors: Doron Shoham, Shoham (IL); Gilad Hazan, Shoham (IL)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/276,394

(22) Filed: Sep. 26, 2016

(51) Int. Cl.
G11C 15/00 (2006.01)
G06F 17/30 (2006.01)
G11C 15/04 (2006.01)

(52) U.S. Cl.
CPC ........ G06F 17/30982 (2013.01); G11C 15/00 (2013.01); G11C 15/04 (2013.01)

(58) Field of Classification Search
CPC ......... G11C 15/00; G11C 15/02; G11C 15/04; G11C 15/043; G11C 15/046; G11C 15/06; G06F 17/30982
See application file for complete search history.

(56) References Cited

U.S. PATENT DOCUMENTS

| 6,715,029 | B1 | 3/2004 | Trainin et al. |
| 6,862,281 | B1 | 3/2005 | Chandrasekaran |
| 7,028,136 | B1 | 4/2006 | Priyadarshan et al. |
| 7,062,601 | B2 * | 6/2006 | Becca ............. G06F 13/18 707/E17.033 |
| 7,065,609 | B2 | 6/2006 | Eatherton et al. |
| 7,103,708 | B2 | 9/2006 | Eatherton et al. |
| 7,237,059 | B2 | 6/2007 | Eatherton et al. |
| 7,346,731 | B2 * | 3/2008 | Narayanaswamy ... G11C 15/00 711/108 |
| 7,680,978 | B1 | 3/2010 | Narayan et al. |
| 7,773,590 | B2 | 8/2010 | Kogan et al. |

(Continued)

OTHER PUBLICATIONS

"Using the Music ATMCAM" Application Note AN-N15, Rev. 0a, Music Semiconductors, Milpitas, CA, Sep. 30, 1998, 20 pages.

(Continued)

*Primary Examiner* — Harry W Byrne
*Assistant Examiner* — R Lance Reidlinger
(74) *Attorney, Agent, or Firm* — The Law Office of Kirk D. Williams

(57) ABSTRACT

In one embodiment, an associative memory is built using multiple cascaded associative memory blocks, with stored lookup words spanning a same or different numbers of associative memory blocks. A first lookup operation is performed by a first associative memory to generate first matching indications of associative entries of the first associative memory that match both the first lookup word and the first lookup type. A second lookup operation is performed by an end associative memory to generate end matching indications of associative entries of the end associative memory that match both the end lookup word and the end of word lookup type. A final lookup result indicating a matching multi-block spanning associative memory entry based on the first matching indications and the end matching indications is determined and signaled by the associative memory is built using multiple cascaded associative memory blocks.

20 Claims, 8 Drawing Sheets

(56) References Cited

U.S. PATENT DOCUMENTS 7,941,605 B1    5/2011   Oren et al.
9,021,195 B2    4/2015   Shoham et al.
2014/0059288 A1  2/2014   Shoham et al.

OTHER PUBLICATIONS

"Extending the LANCAM Comparand," Application Brief AB N3, Rev. 1.0a Draft, Music Semiconductors Milpitas, CA, Sep. 30, 1998, 4 pages.

* cited by examiner

ASSOCIATIVE MEMORY INCLUDING MULTIPLE CASCADED ASSOCIATIVE MEMORY BLOCKS AND ITS USE IN FORWARDING PACKETS IN A NETWORK

TECHNICAL FIELD

The present disclosure relates generally to an associative memory (e.g., a binary or ternary content-addressable memory) built using multiple cascaded associative memory blocks, and including its use by packet switching devices in determining how to forward packets in a network.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Associative memories (e.g., binary and ternary content-addressable memories) are particularly useful in performing lookup operations in determining how to forward a packet in a network by a packet switching device.

BRIEF DESCRIPTION OF THE DRAWINGS

The appended claims set forth the features of one or more embodiments with particularity. The embodiment(s), together with its advantages, may be understood from the following detailed description taken in conjunction with the accompanying drawings of which:

DESCRIPTION OF EXAMPLE EMBODIMENTS

1. Overview

Figure 1:
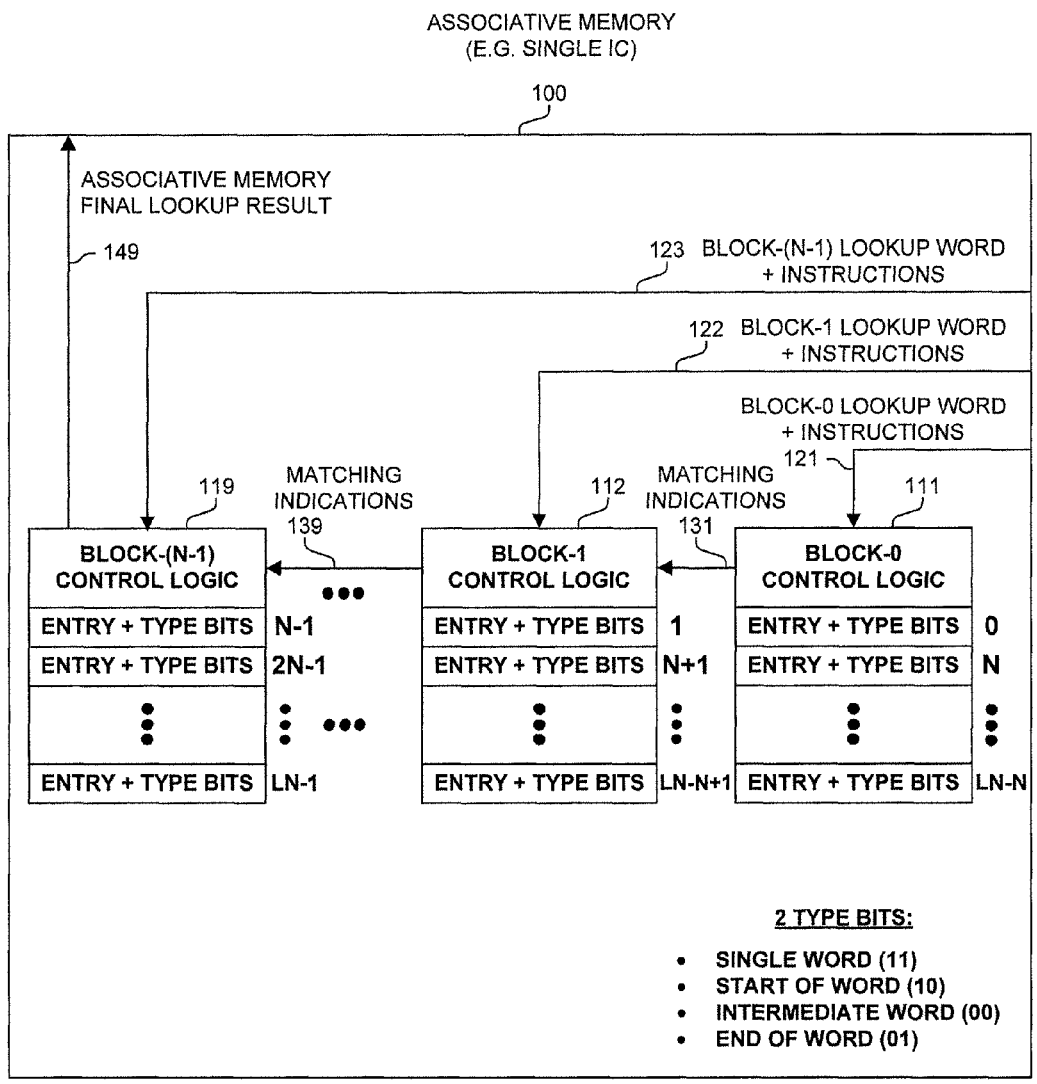
FIG. 1 illustrates an associative memory operating according to one embodiment.

Disclosed are, inter alia, methods, apparatus, computer-storage media, mechanisms, and means associated with an associative memory built using multiple cascaded associative memory blocks. One embodiment performs a method, comprising: performing operations by an associative memory including a plurality of associative memory blocks arranged in a cascaded topology and including a first associative memory block and an end associative memory block, with each of the associative memory blocks including multiple associative memory entries. In one embodiment, these operations include: in response to receiving a first lookup word and a first lookup type, performing a first lookup operation by the first associative memory to generate first matching indications of the associative entries of the first associative memory that match both the first lookup word and the first lookup type; in response to receiving an end lookup word and an end of word lookup type, performing a second lookup operation by the end associative memory to generate end matching indications of the associative entries of the end associative memory that match both the end lookup word and the end of word lookup type; and generating a lookup result indicating a matching multi-block spanning associative memory entry based on said first matching indications and said end matching indications.

In one embodiment, the plurality of associative memory blocks includes an intermediate associative memory block. In one embodiment, these operations include in response to receiving an intermediate lookup word and an intermediate lookup type, performing an intermediate lookup operation by the intermediate associative memory to generate intermediate matching indications of the associative entries of the intermediate associative memory that match both the intermediate lookup word and the intermediate lookup type; and wherein generating the lookup result indicating the matching multi-block spanning associative memory entry is further based on the intermediate matching indications.

In one embodiment, both said first matching indications and said end matching indications indicate a match at the same address position corresponding to the matching multi-block spanning associative memory entry. In one embodiment, the associative memory is used determining how to forward a packet by a packet switching device in a network.

2. Description

Disclosed are, inter alia, methods, apparatus, computer-storage media, mechanisms, and means associated with an associative memory built using multiple cascaded associative memory blocks. Embodiments described herein include various elements and limitations, with no one element or limitation contemplated as being a critical element or limitation. Each of the claims individually recites an aspect of the embodiment in its entirety. Moreover, some embodiments described may include, but are not limited to, inter alia, systems, networks, integrated circuit chips, embedded processors, ASICs, methods, and computer-readable media containing instructions. One or multiple systems, devices, components, etc., may comprise one or more embodiments, which may include some elements or limitations of a claim being performed by the same or different systems, devices, components, etc. A processing element may be a general processor, task-specific processor, a core of one or more processors, or other co-located, resource-sharing implementation for performing the corresponding processing. The embodiments described hereinafter embody various aspects and configurations, with the figures illustrating exemplary and non-limiting configurations. Computer-readable media and means for performing methods and processing block operations (e.g., a processor and memory or other apparatus configured to perform such operations) are disclosed and are in keeping with the extensible scope of the embodiments. The term "apparatus" is used consistently herein with its common definition of an appliance or device.

The steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation). Also, nothing described or referenced in this document is admitted as prior art to this application unless explicitly so stated.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc., are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps. Finally, the term "particular machine," when recited in a method claim for performing steps, refers to a particular machine within the 35 USC §101 machine statutory class.

FIG. 1 illustrates an associative memory 100 operating according to one embodiment. As shown, associative memory 100 is built using N associative memory blocks 111-119 (numbered 0 to N−1). As shown, each block 111-119 includes control logic and L associative memory entries. In one embodiment, the numbering of associative memory entries in associative memory 100 starts with entry zero of block-0 (111), then entry zero of block-1 (112), and so on to entry zero of block-(N−1) (119), then entry one of block-0 (111), and so on. This numbering is used in determining which entry is the associative memory final lookup result 149 when multiple matching entries are generated during a lookup operation.

Associative memory 100 allows a stored lookup value to span one or multiple associative memory blocks 111-119, and allows stored lookup values to span different numbers of associative memory blocks 111-119. Each associative memory entry includes a stored lookup value plus a type value (e.g., type bits) to identify what portion of a stored lookup value it corresponds (e.g., start of word, intermediate word, end of word) or identifies the stored lookup value as a complete lookup value (e.g., single word). When a lookup operation is performed, both the stored value and the type value must be matched for the corresponding associative memory entry to be considered as matched.

In this manner, associative memory 100 stores lookup words of different lengths (and even lookup words from multiple different databases) and performs lookup operations on these different lookup word lengths (e.g., stored across different numbers of one or more cascading associative memory blocks 111-119).

In one embodiment, associative memory supports four different type values (thus can be represented by two bits): single word, start of word, intermediate word, and end of word. One embodiment using each of these different type values is described infra in relation to each of FIGS. 3A-D.

As shown, each associative memory block 111-119 receives a lookup word (including a value representing its lookup type) and lookup instructions which are used by control logic to cause the lookup operation to be performed and for each associative memory block to forward its matching indications 131-139 to a next associative memory block 111-119 in the cascaded topology of associative memory blocks 111-119 that is used in building associative memory final lookup result 149. In one embodiment, each of the matching indications 131-139 is a one-dimensional array indicating which associative memory entry locations are candidates for being the final lookup result 149, which identifies the matching associative memory entry. This matching associative memory entry may span multiple associative memory blocks 111-119, and in which case, any address within the matching entry may be supplied. In one embodiment, the lowest address of a portion of the matching entry spanning multiple associative memory blocks is provided as the associative memory final lookup result 149.

In one embodiment, lookup value and instructions 121-123 include an instruction to store the supplied lookup value (including its type value) at a specific location within a corresponding associative memory block 111-119. In one embodiment, each associative memory block 111-119 receives the same instruction and decodes whether it pertains to itself.

Figure 2A:
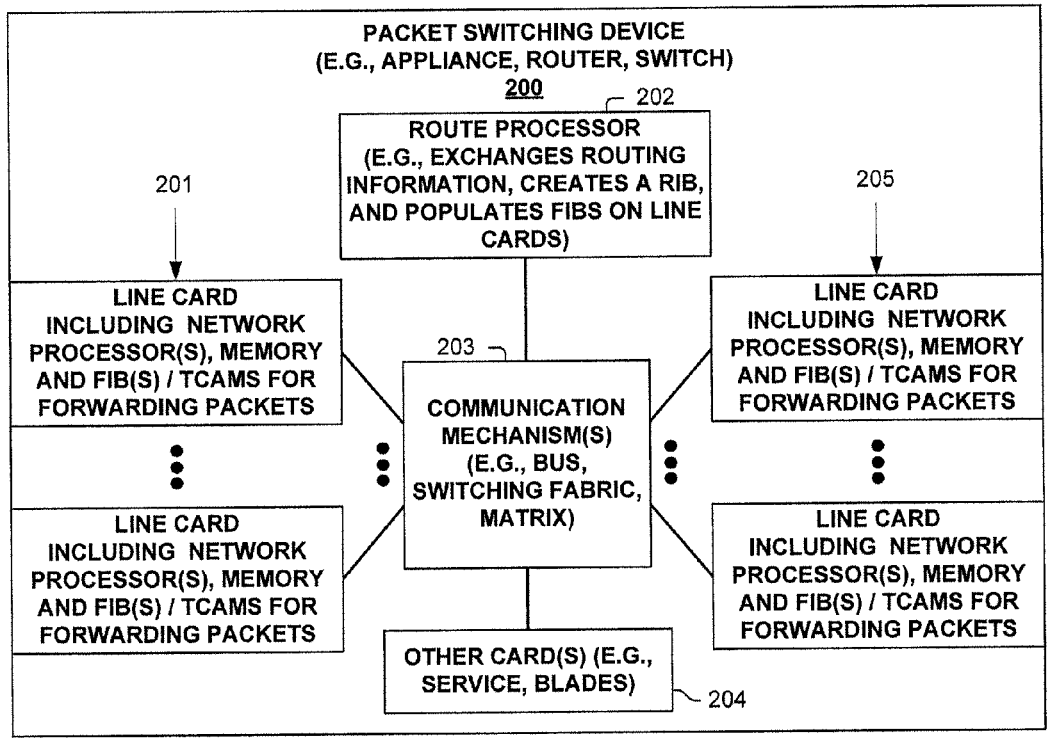
FIG. 2A illustrates a packet switching device according to one embodiment.
Figure 2B:
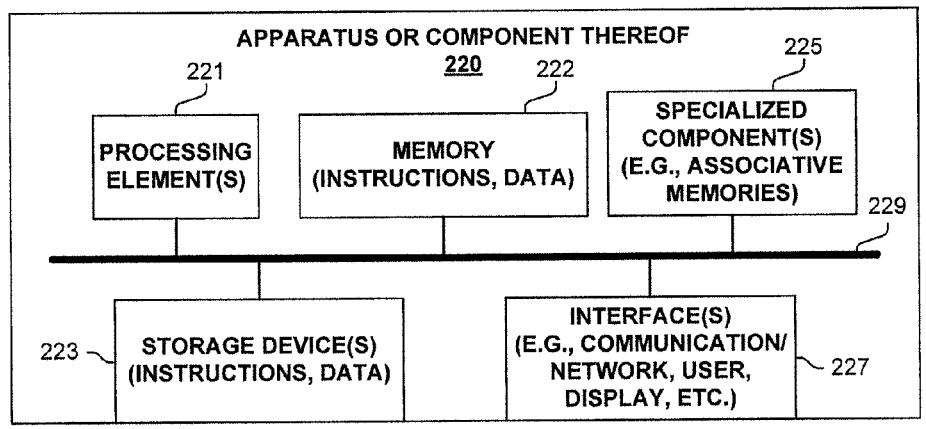
FIG. 2B illustrates an apparatus according to one embodiment.

FIGS. 2A-B and their discussion herein are intended to provide a description of various exemplary packet switching systems used according to one embodiment. One embodiment of a packet switching device 200 is illustrated in FIG. 2A. As shown, packet switching device 200 includes multiple line cards 201 and 205, each with one or more network interfaces for sending and receiving packets over communications links (e.g., possibly part of a link aggregation group), and with one or more processing elements that are used in one embodiment associated with an associative memory built using multiple cascaded associative memory blocks. Packet switching device 200 also has a control plane with one or more processing elements 202 for managing the control plane and/or control plane processing of packets associated with an associative memory built using multiple cascaded associative memory blocks. Packet switching device 200 also includes other cards 204 (e.g., service cards, blades) which include processing elements that are used in one embodiment to process packets associated with an associative memory built using multiple cascaded associative memory blocks, and some communication mechanism 203 (e.g., bus, switching fabric, and/or matrix, etc.) for allowing its different entities 201, 202, 204 and 205 to communicate.

Line cards 201 and 205 typically perform the actions of being both an ingress and egress line card, in regards to multiple other particular packets and/or packet streams being received by, or sent from, packet switching device 200. In one embodiment, network processors on line cards 201 and/or 205 use an associative memory built using multiple cascaded associative memory blocks to determine packet forwarding information (e.g., based on a lookup operation of a destination address, label or some other value) in a forwarding information base (FIB), and forward the packet accordingly.

FIG. 2B is a block diagram of an apparatus 220 used in one embodiment associated with an associative memory built using multiple cascaded associative memory blocks. In one embodiment, apparatus 220 performs one or more processes, or portions thereof, corresponding to one of the flow diagrams illustrated or otherwise described herein, and/or illustrated in another diagram or otherwise described herein.

In one embodiment, apparatus 220 includes one or more processor(s) 221 (typically with on-chip memory), memory 222, storage device(s) 223, specialized component(s) 225 (e.g. optimized hardware such as for performing lookup and/or packet processing operations, performing multiple lookup and/or other operations in parallel, such as, but not limited to an associative memory built using a cascade of multiple associative memory blocks, etc.), and interface(s) 227 for communicating information (e.g., sending and receiving packets, user-interfaces, displaying information, etc.), which are typically communicatively coupled via one or more communications mechanisms 229 (e.g., bus, links, switching fabric, matrix), with the communications paths typically tailored to meet the needs of a particular application.

Various embodiments of apparatus 220 may include more or fewer elements. The operation of apparatus 220 is typically controlled by processor(s) 221 using memory 222 and storage device(s) 223 to perform one or more tasks or processes. Memory 222 is one type of computer-readable/ computer-storage medium, and typically comprises random access memory (RAM), read only memory (ROM), flash memory, integrated circuits, and/or other memory components. Memory 222 typically stores computer-executable instructions to be executed by processor(s) 221 and/or data which is manipulated by processor(s) 221 for implementing functionality in accordance with an embodiment. Storage device(s) 223 are another type of computer-readable medium, and typically comprise solid state storage media, disk drives, diskettes, networked services, tape drives, and other storage devices. Storage device(s) 223 typically store computer-executable instructions to be executed by processor(s) 221 and/or data which is manipulated by processor(s) 221 for implementing functionality in accordance with an embodiment.

FIGS. 3A-3D illustrate the operation of an associative memory 300 built using four associative memory blocks 301-304 arranged in a cascaded topology (i.e., a succession of stages of associative memory blocks). In one embodiment, each associative memory entry of associative memory blocks 301-304 has a width of 162 bits (160 bits of a particular lookup value plus two lookup type bits). In one embodiment, each of associative memory blocks 301-304 includes 512 associative memory entries. FIGS. 3A-3D illustrate one embodiment of associative memory 300 performing lookup operations on lookup words of different lengths (e.g., spanning one to all four associative memory blocks 301-304).

Figure 3A:
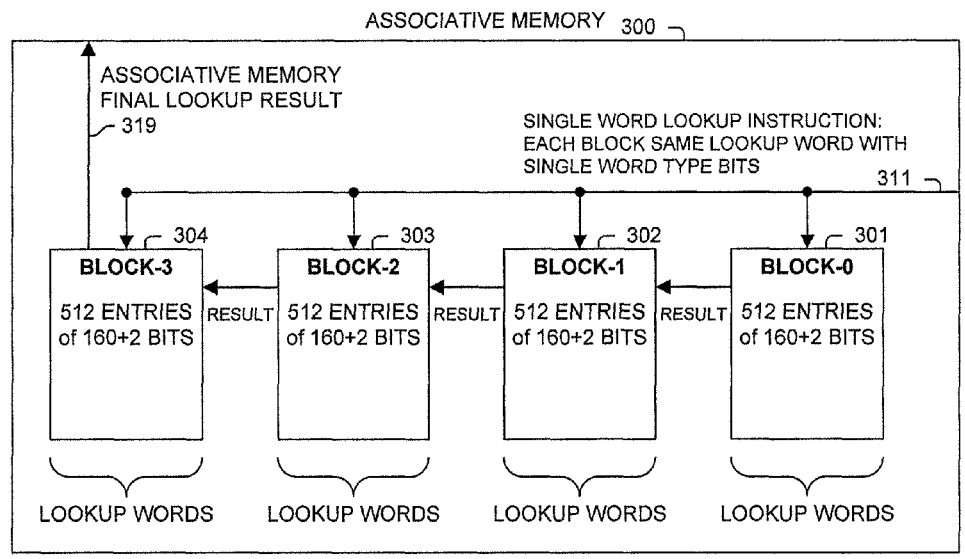
FIG. 3A illustrates an associative memory operating according to one embodiment.

Shown in FIG. 3A is associative memory 300 performing a lookup operation for lookup words that span a single associative memory block 301-304, which are also currently storing lookup words that span multiple associative memory blocks 301-304 (e.g., two, three, four).

As shown, each of associative memory blocks 301-304 receives a single lookup word instruction 311 with a same lookup word including the same single word type bits. Each associative memory block 301-304 performs the lookup operation (typically in parallel or at least overlapping in some portion of time) to determine that no entry matched or a lowest addressed (highest priority) matching entry of its enabled entries matched to supplied lookup word (including the single word type bits). Associative memory block 301 supplies this result to associative memory block 302. Associative memory block 302's result is no match or the lowest addressed matching entry in its block 302 or a previous stage block 301, and provides this result to associative memory block 303. Associative memory block 303's result is no match or the lowest addressed matching entry in its block 303 or a previous stage block 301-302, and provides this result to associative memory block 304. Associative memory block 304's result is no match or the lowest addressed matching entry in its block 304 or a previous stage block 301-303, and signals this result as associative memory final result 319.

Figure 3B:
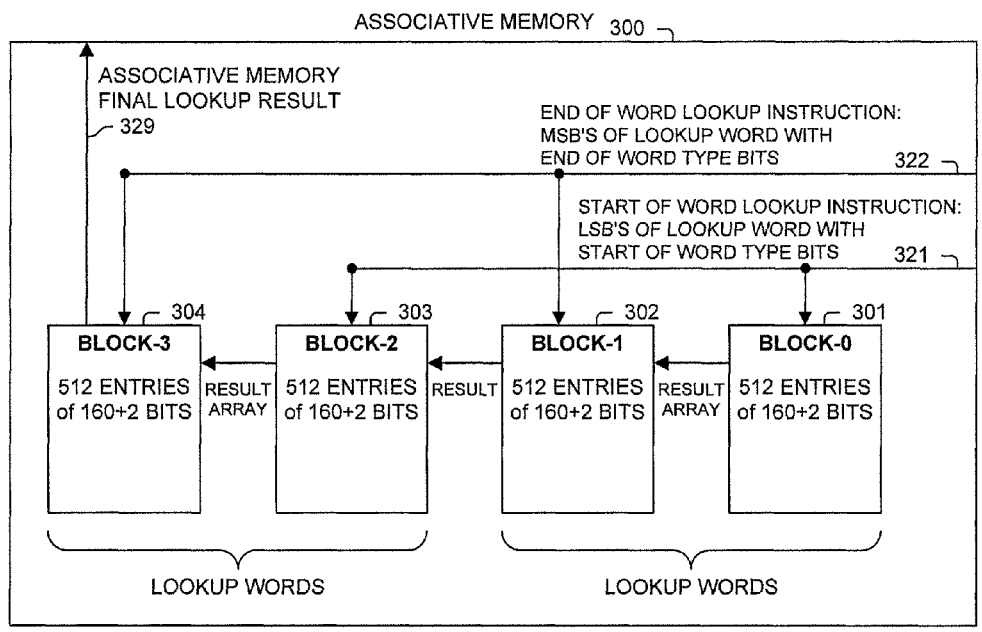
FIG. 3B illustrates an associative memory operating according to one embodiment.

Shown in FIG. 3B is associative memory 300 performing a lookup operation for lookup words that span two associative memory blocks, those being 301-302 and 303-304, which are also currently storing lookup words that span a number of associative memory blocks 301-304 different than two (e.g., one, three, four). In one embodiment, a lookup value is stored in the two associative memory blocks 302-303.

As shown, each of associative memory blocks 301 and 303 receives a start of word lookup instruction 321, including the least significant bits of the dynamic lookup word with the start of word type bits. The term "dynamic" is used herein in referencing the non-type bit portion of a lookup word provided to an associative memory block 301-304. Each of associative memory blocks 302 and 304 receives an end of word lookup instruction 322, including the most significant bits of the dynamic lookup word with the end of word type bits.

Each associative memory block 301-304 performs the lookup operation (typically in parallel or at least overlapping in some portion of time) to determine a one-dimensional array designating which of its enabled entries match the supplied lookup word (including the single word type bits). Respectively, each of associative memory blocks 301 and 303 supply its result array to associative memory block 302 and 304. Each of associative memory blocks 302 and 304 logically AND's its result array and the received result array, and determine a potential result (i.e., highest-priority set bit corresponding to a highest-priority matching entry). Associative memory block 302 forwards its potential result to associative memory block 304 (typically through associative memory block 303). Associative memory block 304 determines that there is no match if there both potential results determined by associative memory block 302 and 304 are no match, with no match signaled as associative memory final lookup result 329. Otherwise, associative memory block 304 determines the lowest address (highest priority entry) of a matching associative memory entry spanning two associative memory blocks by correspondingly selecting between one of the two potential results, and provides this selected potential result as associative memory final lookup result 329.

Figure 3C:
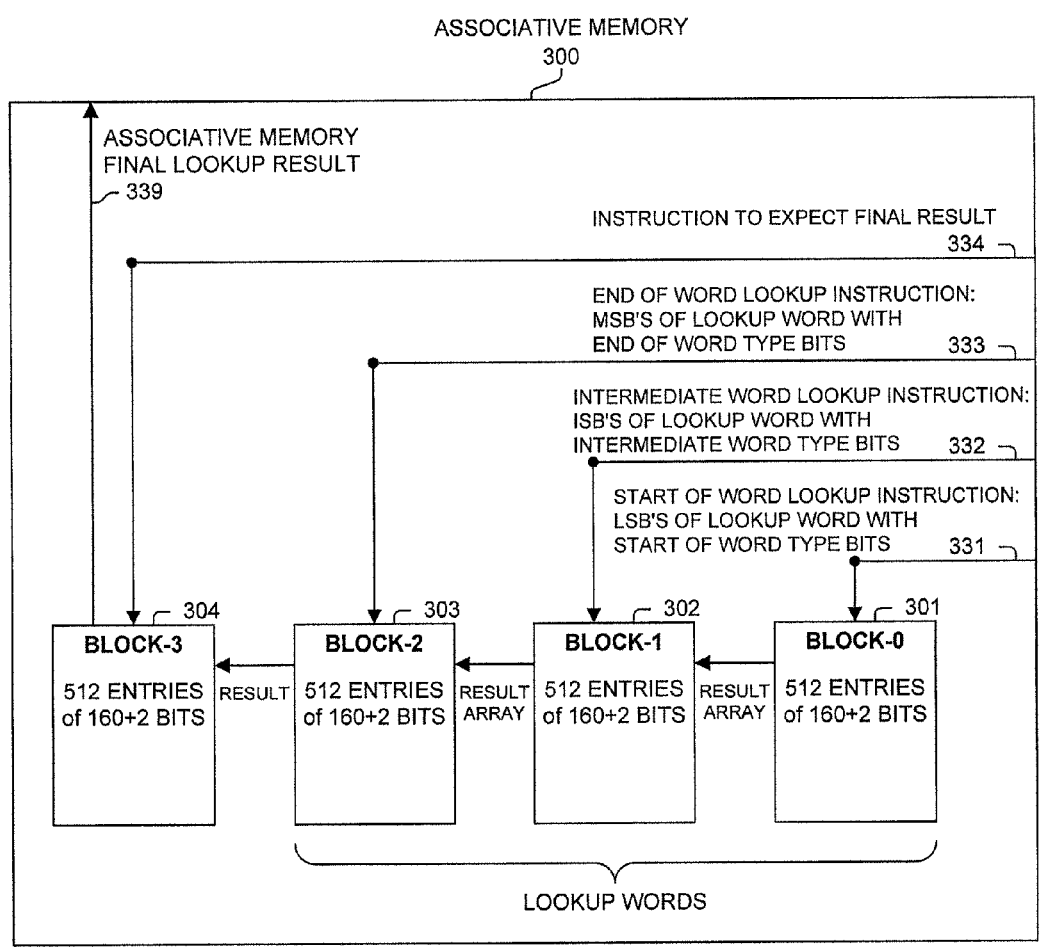
FIG. 3C illustrates an associative memory operating according to one embodiment.

Shown in FIG. 3C is associative memory 300 performing a lookup operation for lookup words that span three associative memory blocks 301-303, which are also currently storing lookup words that span a number associative memory blocks 301-304 different than three (e.g., one, two, four). In one embodiment, a lookup value is stored in the three associative memory blocks 302-304.

As shown, associative memory block 301 receives a start of word lookup instruction 331, including the least significant bits of the dynamic lookup word with the start of word type bits. Associative memory block 302 receives an intermediate word lookup instruction 332, including intermediate significant bits of the dynamic lookup word with the intermediate word type bits. Associative memory block 303 receives an end of word lookup instruction 333, including the most significant bits of the dynamic lookup word with the end of word type bits. Associative memory block 304 receives an instruction 334 to expect a final result from associative memory block 303.

Each associative memory block 301-303 performs the lookup operation (typically in parallel or at least overlapping in some portion of time) to determine a one-dimensional array designating which of its enabled entries matched to supplied lookup word (including the single word type bits). Associative memory block 301 supplies its result array to associative memory block 302. Associative memory block 302 logically AND's its result array and the received result array. Associative memory block 302 forwards this new result array to associative memory block 303. Associative memory block 303 logically AND's its result array and the received result array. Associative memory block 303 determines that there is no match if there is no set bit in the new resultant array, with no match signaled as associative memory final lookup result 339 as provided through associative memory block 304. Otherwise, associative memory block 303 determines the lowest address (highest priority entry) of the matching associative memory entry spanning two associative memory blocks, and provides this address (e.g., potential result which is the final result as no other potential results in this configuration) as associative memory final lookup result 339 through associative memory block 304.

Figure 3D:
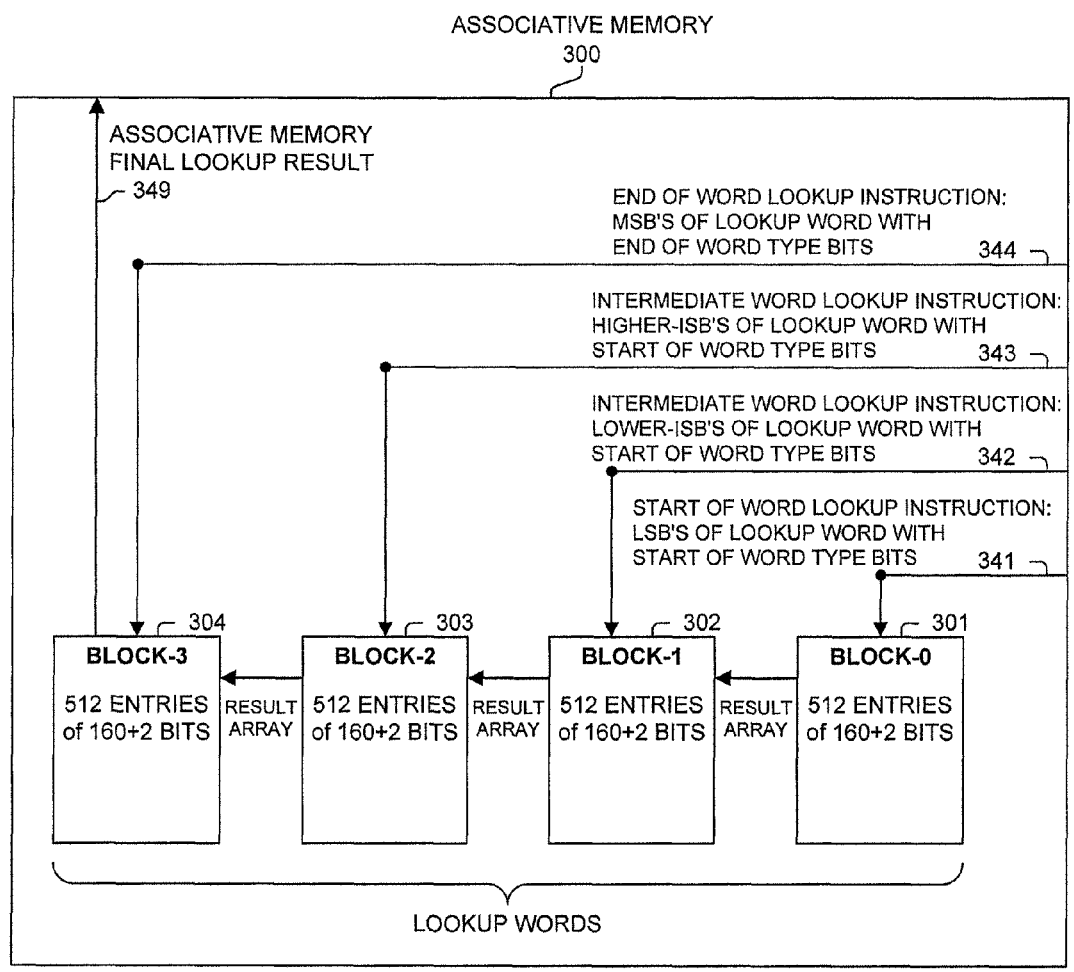
FIG. 3D illustrates an associative memory operating according to one embodiment.

Shown in FIG. 3D is associative memory 300 performing a lookup operation for lookup words that span four associative memory blocks 301-304, which are also currently storing lookup words that span a number of associative memory blocks 301-304 different than four (e.g., one, two, three).

As shown, associative memory block 301 receives a start of word lookup instruction 341, including the least significant bits of the dynamic lookup word with the start of word type bits. Associative memory block 302 receives an intermediate word lookup instruction 342, including the lowest intermediate significant bits of the dynamic lookup word with the intermediate word type bits. Associative memory block 303 receives an intermediate word lookup instruction 343, including the highest intermediate significant bits of the dynamic lookup word with the intermediate word type bits. Associative memory block 304 receives an end of word lookup instruction 344, including the most significant bits of the dynamic lookup word with the end of word type bits.

Each associative memory block 301-304 performs the lookup operation (typically in parallel or at least overlapping in some portion of time) to determine a one-dimensional array designating which of its enabled entries matched to supplied lookup word (including the single word type bits). Associative memory block 301 supplies its result array to associative memory block 302. Associative memory block 302 logically AND's its result array and the received result array. Associative memory block 302 forwards this new result array to associative memory block 303. Associative memory block 303 logically AND's its result array and the received result array. Associative memory block 303 forwards this new result array to associative memory block 304. Associative memory block 304 logically AND's its result array and the received result array. Associative memory block 304 determines that there is no match if there is no set bit in the new resultant array, with no match signaled as associative memory final lookup result 349. Otherwise, associative memory block 304 determines the lowest address (highest priority entry) of the matching associative memory entry spanning four associative memory blocks, and provides this address as associative memory final lookup result 349.

Figure 4A:
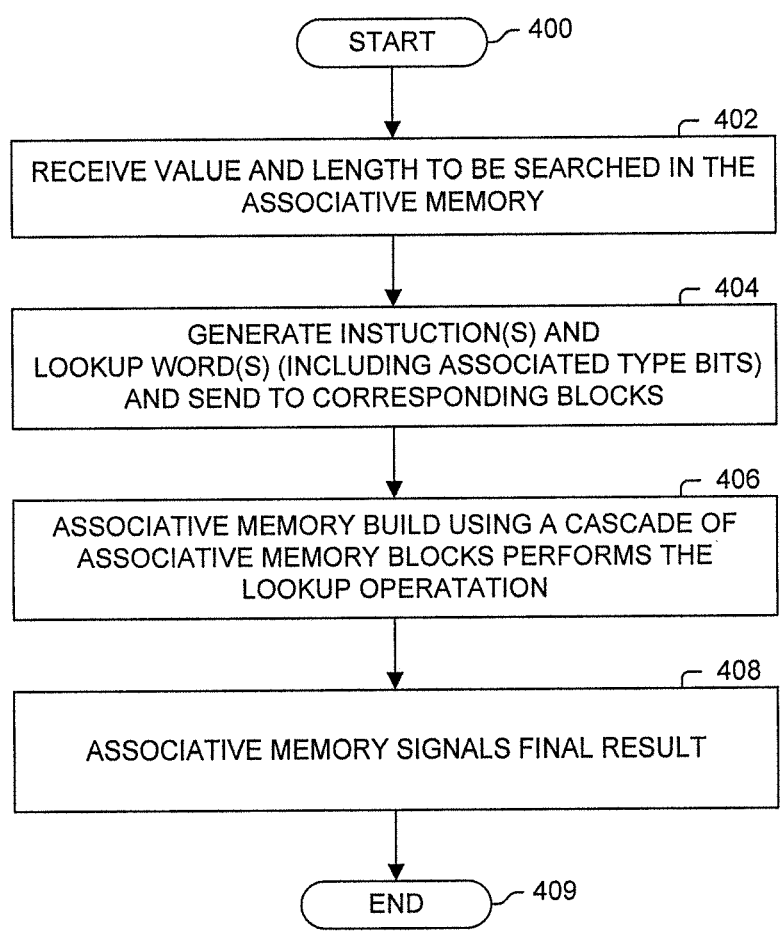
FIG. 4A illustrates a process according to one embodiment.

FIG. 4A illustrates a process performed in one embodiment by an associative memory built using a cascade of associative memory blocks. Processing beings with process block 400. In process block 402, a dynamic lookup word value and lookup word length is received. Next, in process block 404, the lookup word instruction(s) and lookup word(s) for individual associative memory blocks are generated and communicated to corresponding associative memory blocks. In process block 406, the associative memory built using a cascade of associative memory blocks performs the lookup operation. In process block 408, the final result is signaled by the associative memory built using a cascade of associative memory blocks. Processing of the flow diagram of FIG. 4A is complete as indicated by process block 409.

Figure 4B:
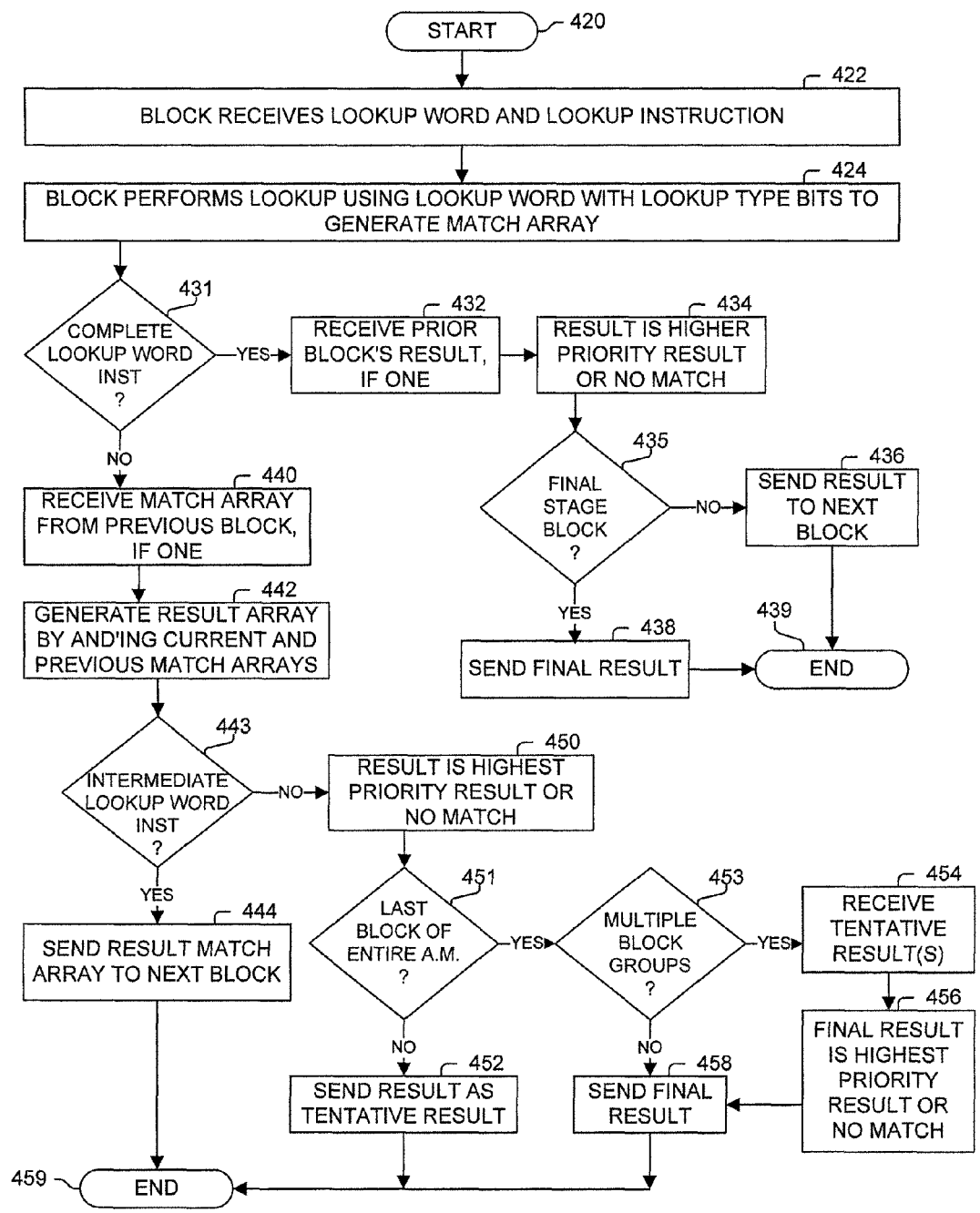
FIG. 4B illustrates a process according to one embodiment.

FIG. 4B illustrates a process performed in one embodiment by an associative memory block of an associative memory built using a cascade of associative memory blocks. Processing beings with process block 420. In process block 422, the associative memory block receives the lookup word and instruction. Next in process block 424, the associative memory block performs its lookup operation on the lookup word (including the dynamic portion and type bits) to match against stored lookup words producing a match array designating matching entries (e.g., a bit of value '1' indicates a corresponding matching entry, and a bit of value '0' indicates a corresponding non-matching entry—or non-enabled entry). As determined in process block 431, if the lookup operation is a complete word instruction, then processing proceeds to process block 432, otherwise processing proceeds to process block 440.

In process block 432, the associative memory block receives the prior block's result of the lowest matching entry address or no match, if there is a prior associative memory block in the cascade. In process block 434, a determination is made between a received matching entry address and the block's determined matching address to determine which is the highest priority (lowest address) matching entry—or that there is no matching entry found in the current or any previous block in the cascade. As determined in process block 435, if this block is the final stage block, then processing proceeds to process block 438, else processing proceeds to process block 436. In process block 436, the result is forwarded to a next block in the cascade, and processing of the flow diagram of FIG. 4B is complete as indicated by process block 439. In process block 438, the result is signaled as the final result, and processing of the flow diagram of FIG. 4B is complete as indicated by process block 439.

In process block 440, the match array is received from the previous block, if there is a previous block in the cascade. In process block 442, the new result array is generated by AND'ing the current and received matching result arrays.

As determined in process block 443, if the current block is operating according to an intermediate lookup word instruction, then in process block 444 the result match array is sent to the next block in the cascade, and processing of the flow diagram of FIG. 4B is complete as indicated by process block 459.

Otherwise, as determined in process block 443, the current block is not operating according to an intermediate lookup word instruction (hence operating according to an end of word instruction), and processing proceeds to process block 450, wherein the highest priority (lowest address) matching entry—or that there is no matching entry found in the current or any previous block in the cascade is determined as the result of this associative memory block.

However, as shown in FIG. 3C, multiple associative memory blocks may be operating according to a final word operation, and a last stage of the cascade needs to determine a final result among these tentative results. So, as determined in process block 451, if this block is not the last block of the entire associative memory (i.e., not the last block in the cascade), then in process block 452 this result is provided to a next block in the cascade as a tentative result of the lookup operation with this tentative result propagating to the last block in the cascade, and processing of the flow diagram of FIG. 4B is complete as indicated by process block 459.

Otherwise, it was determined in process block 451 that this block is the last block of the entire associative memory (i.e., the last block in the cascade), and processing proceeds to process block 453.

As determined in process block 453, if there are multiple block groups performing independent tentative-result lookup operations (e.g., as two are shown in FIG. 3B in contrast to the single lookup operation as shown in FIG. 3C), then processing proceeds to process block 454; otherwise processing proceeds directly to process block 458. In process block 454 the block waits and receives all prior tentative results from each other of the block groups. After which in process block 456, the final result is the highest priority (lowest address) matching entry—or that there is no matching entry found in the current or any previous block in the cascade is determined as the result of this associative memory block and processing proceeds to process block 458.

In process block 458, the final result of the matching address or a no match is signaled, and processing of the flow diagram of FIG. 4B is complete as indicated by process block 459.

Figure 5:
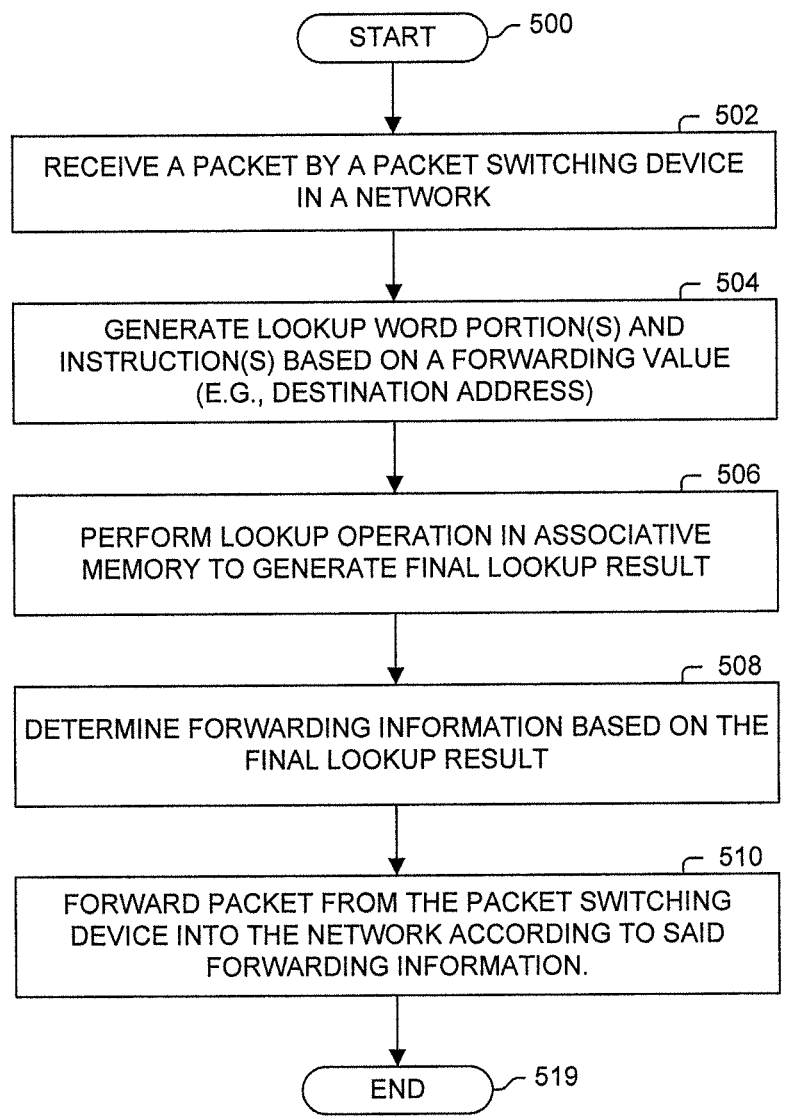
FIG. 5 illustrates a process according to one embodiment.

FIG. 5 illustrates a process performed in one embodiment. Processing begins with process block 500. In process block 502, a packet switching device receives a packet. In process block 504, lookup word portion(s) and instruction(s) are generated based on a forwarding value (e.g., destination address, label, or other value). In process block 506, a corresponding lookup operation is performed in the associative memory built using a cascade of associative memory blocks. In process block 508, forwarding information is determined based on the final result from the associative memory built using a cascade of associative memory blocks. In process block 510, the packet is forwarded according to the forwarding information. Processing of the flow diagram of FIG. 5 is complete as indicated by process block 519.

In view of the many possible embodiments to which the principles of the disclosure may be applied, it will be appreciated that the embodiments and aspects thereof described herein with respect to the drawings/figures are only illustrative and should not be taken as limiting the scope of the disclosure. For example, and as would be apparent to one skilled in the art, many of the process block operations can be re-ordered to be performed before, after, or substantially concurrent with other operations. Also, many different forms of data structures could be used in various embodiments. The disclosure as described herein contemplates all such embodiments as may come within the scope of the following claims and equivalents thereof.

What is claimed is:

1. An apparatus, comprising:
an associative memory including a plurality of associative memory blocks arranged in a cascaded topology and including a first associative memory block and an end associative memory block, with each of the plurality of associative memory blocks including a plurality of associative memory entries;
wherein the first associative memory block includes a plurality of first associative memory entries, with each of the plurality of first associative memory entries including a stored different first portion of a search value and a stored start of word value, with each of the plurality of first associative memory entries performing matching operations against a supplied first lookup word portion and a supplied first lookup type to generate indications of first matching entries of the plurality of first associative memory entries in which the stored different first portion and the stored start of word value respectfully match the supplied first lookup word portion and the supplied first lookup type;
wherein the end associative memory block includes a plurality of end associative memory entries, with each of the plurality of end associative memory entries including a stored different end portion of the search value and a stored end of word value, with each of the plurality of end associative memory entries performing matching operations against a supplied end lookup word portion and a supplied end lookup type to generate indications of end matching entries of the plurality of end associative memory entries in which the stored different end portion and the stored end of word value respectfully match the supplied end lookup word portion and the supplied end lookup type; and
wherein the associative memory generates a lookup result indicating a position of a matching multi-block spanning entry in which corresponding locations of entries within the first associative memory block and the end associative memory block said generated indications of first and end matching entries.

2. The apparatus of claim 1, wherein a single integrated circuit includes the associative memory.

3. The apparatus of claim 1, wherein each of the plurality of associative memory entries is a ternary content-addressable memory entry.

4. The apparatus of claim 1, wherein each of the plurality of associative memory entries is a binary content-addressable memory entry.

5. The apparatus of claim 1, wherein the plurality of associative memory blocks includes another first associative memory block and another end associative memory block; wherein the associative memory generates a second lookup result indicating a position of a second multi-block spanning entry in which corresponding locations of entries within said another first associative memory block and said another end associative memory block said generated indications of another first and another end matching entries.

6. The apparatus of claim 5, wherein the associative memory generates an indication of an associative memory final lookup result as either being the lookup result or the second lookup result.

7. The apparatus of claim 1, wherein an associative memory final lookup result is an associative memory final lookup result of the associative memory.

8. The apparatus of claim 1, comprising:
a plurality of interfaces configured to send and receive packets;
a network processor with associated memory; and
one or more packet switching mechanisms configured to packet switch packets among said interfaces;
wherein the network processor is communicatively coupled to the associative memory which stores forwarding information for packet processing operations.

9. An apparatus, comprising:
an associative memory including a plurality of associative memory blocks arranged in a cascaded topology and including a first associative memory block, one or more intermediate blocks, and an end associative memory block, with each of the plurality of associative memory blocks including a plurality of associative memory entries;
wherein the first associative memory block includes a plurality of first associative memory entries, with each of the plurality of first associative memory entries including a stored different first portion of a search value and a stored start of word value, with each of the plurality of first associative memory entries performing matching operations against a supplied first lookup word portion and a supplied first lookup type to generate indications of first matching entries of the plurality of first associative memory entries in which the stored different first portion and the stored start of word value respectfully match the supplied first lookup word portion and the supplied first lookup type;
wherein each of said one or more intermediate associative memory blocks includes a plurality of intermediate associative memory entries, with each of the plurality of intermediate associative memory entries including a stored different intermediate portion of a search value and a stored intermediate word value, with each of the plurality of intermediate associative memory entries performing matching operations against a supplied intermediate lookup word portion and a supplied intermediate lookup type to generate indications of intermediate matching entries of the plurality of intermediate associative memory entries in which the stored different intermediate portion and the stored intermediate word value respectfully match the supplied intermediate lookup word portion and the supplied intermediate lookup type;
wherein the end associative memory block includes a plurality of end associative memory entries, with each of the plurality of end associative memory entries including a stored different end portion of the search value and a stored end of word value, with each of the plurality of end associative memory entries performing matching operations against a supplied end lookup word portion and a supplied end lookup type to generate indications of end matching entries of the plurality of end associative memory entries in which the stored different end portion and the stored end of word value respectfully match the supplied end lookup word portion and the supplied end lookup type; and
wherein the associative memory generates a final lookup result indicating a position of a matching overall entry in which corresponding locations of entries within the first associative memory block, each of said one or more intermediate associative memory blocks, and the end associative memory block said generated indications of first, intermediate, and end matching entries.

10. The apparatus of claim 9, wherein said one or more intermediate associative memory blocks consists of a single intermediate associative memory block.

11. The apparatus of claim 9, wherein a single integrated circuit includes the associative memory.

12. The apparatus of claim 9, wherein each of the plurality of associative memory entries is a ternary content-addressable memory entry.

13. The apparatus of claim 9, wherein each of the plurality of associative memory entries is a binary content-addressable memory entry.

14. The apparatus of claim 9, comprising:
a plurality of interfaces configured to send and receive packets;
a network processor with associated memory; and
one or more packet switching mechanisms configured to packet switch packets among said interfaces;
wherein the said the network processor is communicatively coupled to the associative memory which stores forwarding information for packet processing operations.

15. A method, comprising:
performing operations by an associative memory including a plurality of associative memory blocks arranged in a cascaded topology and including a first associative memory block and an end associative memory block, with each of the plurality of associative memory blocks including a plurality of associative memory entries, and wherein said operations include:
in response to receiving a first lookup word and a first lookup type, performing a first lookup operation by the first associative memory to generate first matching indications of said associative entries of the first associative memory that match both the first lookup word and the first lookup type;
in response to receiving an end lookup word and an end of word lookup type, performing a second lookup operation by the end associative memory to generate end matching indications of said associative entries of the end associative memory that match both the end lookup word and the end of word lookup type; and
generating a lookup result indicating a matching multi-block spanning associative memory entry based on said first matching indications and said end matching indications.

16. The method of claim 15, wherein both said first matching indications and said end matching indications indicate a match at the same address position corresponding to said matching multi-block spanning associative memory entry.

17. The method of claim 15, wherein the plurality of associative memory blocks includes an intermediate associative memory block;
wherein said operations include in response to receiving an intermediate lookup word and an intermediate lookup type, performing an intermediate lookup operation by the intermediate associative memory to generate intermediate matching indications of said associative entries of the intermediate associative memory that match both the intermediate lookup word and the intermediate lookup type; and wherein said generating the lookup result indicating the matching multi-block spanning associative memory entry is further based on said intermediate matching indications.

18. The method of claim 15, wherein all of said first matching indications, said intermediate matching indications, and said end matching indications indicate a match at the same address position corresponding to said matching multi-block spanning associative memory entry.

19. The method of claim 15, wherein each of the plurality of associative memory entries is a ternary content-addressable memory entry.

20. The method of claim 15, comprising:

receiving a packet by a packet switching device;

generating the first lookup word and end lookup word based on a forwarding value extracted from the packet by a packet switching device;

determining forwarding information for the packet based on the lookup result by a packet switching device; and forwarding the packet from the packet switching device based on said determined forwarding information.

\* \* \* \* \*